(12) United States Patent
Shifren et al.

(10) Patent No.: US 10,707,415 B2
(45) Date of Patent: Jul. 7, 2020

(54) METHODS AND PROCESSES FOR FORMING DEVICES FROM CORRELATED ELECTRON MATERIAL (CEM)

(71) Applicant: Arm Limited, Cambridge (GB)

(72) Inventors: Lucian Shifren, San Jose, CA (US); Kimberly Gay Reid, Austin, TX (US); Gregory Munson Yeric, Austin, TX (US); Manuj Rathor, Fremont, CA (US); Glen Arnold Rosendale, Palo Alto, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/200,214

(22) Filed: Nov. 26, 2018

(65) Prior Publication Data

US 2019/0173008 A1 Jun. 6, 2019

Related U.S. Application Data

(62) Division of application No. 15/414,520, filed on Jan. 24, 2017, now Pat. No. 10,141,504.

(51) Int. Cl.
*H01L 45/00* (2006.01)
*H01L 27/24* (2006.01)
*H01L 25/00* (2006.01)

(52) U.S. Cl.
CPC .............. *H01L 45/14* (2013.01); *H01L 25/50* (2013.01); *H01L 27/2436* (2013.01); *H01L 27/2463* (2013.01); *H01L 45/04* (2013.01); *H01L 45/065* (2013.01); *H01L 45/10* (2013.01); *H01L 45/1233* (2013.01); *H01L 45/145* (2013.01); *H01L 45/146* (2013.01); *H01L 45/147* (2013.01); *H01L 45/16* (2013.01)

(58) Field of Classification Search
CPC ......... H01L 45/14; H01L 45/16; H01L 45/10; H01L 45/1233; H01L 45/147; H01L 45/145; H01L 45/065; H01L 27/2463
See application file for complete search history.

(56) References Cited

U.S. PATENT DOCUMENTS

| | | |
|---|---|---|
| 7,298,640 B2 | 11/2007 | Chen et al. |
| 7,639,523 B2 | 12/2009 | Celinska et al. |
| 7,778,063 B2 | 8/2010 | Brubaker et al. |
| 7,872,900 B2 | 1/2011 | Paz De Araujo et al. |

(Continued)

OTHER PUBLICATIONS

Notification of Transmittal of the International Search Report and the Written Opinion of the International Searching Authority, or the Declaration, International Application No. PCT/GB2018/050185, dated Jun. 8, 2018, 1 pg.

(Continued)

*Primary Examiner* — Selim U Ahmed
*Assistant Examiner* — Evan G Clinton
(74) *Attorney, Agent, or Firm* — Berkeley Law & Technology Group, LLP

(57) ABSTRACT

Subject matter disclosed herein may relate to fabrication of correlated electron materials used, for example, to perform specified application performance parameters. In embodiments, CEM devices fabricated at a first stage of a wafer fabrication process, such as a front-end-of-line stage, may differ from CEM devices fabricated at a second stage of a wafer fabrication process, such as a middle-of-line stage or a back-end-of-line stage, for example.

17 Claims, 12 Drawing Sheets

(56) References Cited

U.S. PATENT DOCUMENTS

| | | | |
|---|---|---|---|
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 9,627,615 | B1 | 4/2017 | Reid et al. |
| 2007/0065961 | A1 | 3/2007 | Park et al. |
| 2007/0228414 | A1 | 10/2007 | Kumar et al. |
| 2008/0106926 | A1 | 5/2008 | Brubaker |
| 2008/0107801 | A1 | 5/2008 | Celinska et al. |
| 2011/0049464 | A1* | 3/2011 | Lee .......... H01L 45/04 257/4 |
| 2013/0200323 | A1 | 8/2013 | Pram et al. |
| 2013/0214232 | A1 | 8/2013 | Tendulkar et al. |
| 2013/0285699 | A1 | 10/2013 | McWilliams et al. |
| 2014/0175355 | A1 | 6/2014 | Wang et al. |
| 2014/0175367 | A1* | 6/2014 | Tendulkar ........ H01L 45/1616 257/4 |
| 2015/0236257 | A1* | 8/2015 | Walls .......... H01L 45/1273 257/3 |
| 2016/0163978 | A1 | 6/2016 | Paz De Araujo et al. |
| 2017/0033782 | A1 | 2/2017 | Shifren et al. |
| 2017/0045905 | A1 | 2/2017 | Sandhu et al. |
| 2017/0047116 | A1 | 2/2017 | Sandhu et al. |
| 2017/0047919 | A1 | 2/2017 | Sandhu et al. |
| 2017/0069378 | A1 | 3/2017 | Shifren et al. |
| 2018/0151224 | A1* | 5/2018 | Chih .......... G11C 13/004 |
| 2019/0036020 | A1* | 1/2019 | Majhi .......... H01L 45/1253 |

OTHER PUBLICATIONS

The International Search Report, International Application No. PCT/GB2018/050185, dated Jun. 8, 2018, 9 pgs.
The Written Opinion of the International Searching Authority, International Application No. PCT/GB2018/050185, dated Jun. 8, 2018, 12 pgs.
Invitation to Pay Additional Fees and where applicable, Protest Fee, International Application No. PCT/GB2018/050185, dated Apr. 18, 2018, 15 pgs.
U.S. Appl. No. 15/414,520, filed Jan. 24, 2017, 80 pgs.
Informational Notice to Applicant, dated Feb. 1, 2017, 1 pg.
Response to Informational Notice to Applicant, filed Aug. 15, 2017, 9 pgs.
Restriction Requirement, dated Oct. 30, 2017, 7 pgs.
Response to Restriction Requirement, filed Dec. 5, 2017, 9 pgs.
Non-Final Office Action, dated Mar. 8, 2018, 14 pgs.
Response to Non-Final Office Action, filed May 23, 2018, 9 pgs.
Notice of Allowance, dated Jul. 12, 2018, 12 pgs.
Issue Fee Payment and Rule 312 Amendment, filed Oct. 10, 2018, 10 pgs.
Response to Rule 312 Amendment, dated Oct. 25, 2018, 2 pgs.
Issue Notification, dated Nov. 7, 2018, 1 pg.
Notification Concerning Transmittal of International Preliminary Report on Patentability, App. No. PCT/GB2018/050185, dated Aug. 8, 2019, 1 Page.
International Preliminary Report on Patentability, App. No. PCT/GB2018/050185, dated Aug. 6, 2019, 1 Page.
Written Opinion of International Searching Authority, App. No. PCT/GB2018/050185, dated Aug. 8, 2019, 10 Pages.

* cited by examiner

807

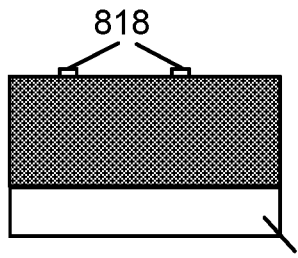

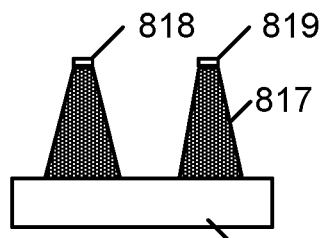

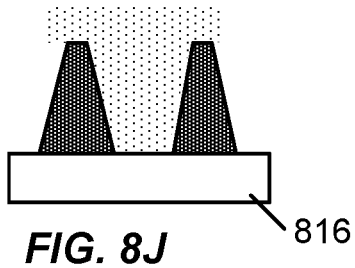

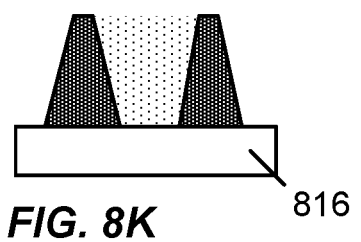

Determine electrical characteristics of one or more CEM devices to be formed at a fabrication stage of a manufacturing process

920

In response to determining the electrical characteristics of the one or more CEM devices and in response to specified application performance parameters of the one or more CEM devices:
form of one or more CEM devices at the fabrication stage according to physical dimensional parameters and/or compositional parameters

FIG. 9A

METHODS AND PROCESSES FOR FORMING DEVICES FROM CORRELATED ELECTRON MATERIAL (CEM)

RELATED APPLICATIONS

This application is a divisional of U.S. application Ser. No. 15/414,520, entitled "METHODS AND PROCESSES FOR FORMING DEVICES FROM CORRELATED ELECTRON MATERIAL (CEM)," filed Jan. 24, 2017 and which issued as U.S. Pat. No. 10,141,504, which is assigned to the assignee hereof and is expressly incorporated herein by reference.

BACKGROUND

Field

This disclosure relates to correlated electron devices, and may relate, more particularly, to approaches toward fabricating correlated electron devices.

Information

Integrated circuit devices, such as electronic switching devices, for example, may be found in a wide range of electronic device types. For example, memory and/or logic devices may incorporate electronic switches suitable for use in computers, digital cameras, smart phones, tablet devices, personal digital assistants, and so forth. Factors that relate to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, and/or reliability. Moreover, there appears to be an ever-increasing need for memory and/or logic devices that exhibit characteristics of lower power and/or higher speed. A need for lower power and/or higher speed devices may involve a number of device types which may, for example, include devices fabricated at front end of line (FEOL), middle of line (MOL), back end of line (BEOL), and so forth, of a wafer fabrication process.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIGS. 8H-8K illustrate subprocesses utilized in forming the inverted trapezoidal-shaped CEM device of FIG. 8D according to an embodiment; and FIG. 9A is a flowchart for a method for forming devices from CEM according to a fabrication stage of a wafer fabrication process according to an embodiment.

Figure 1A:
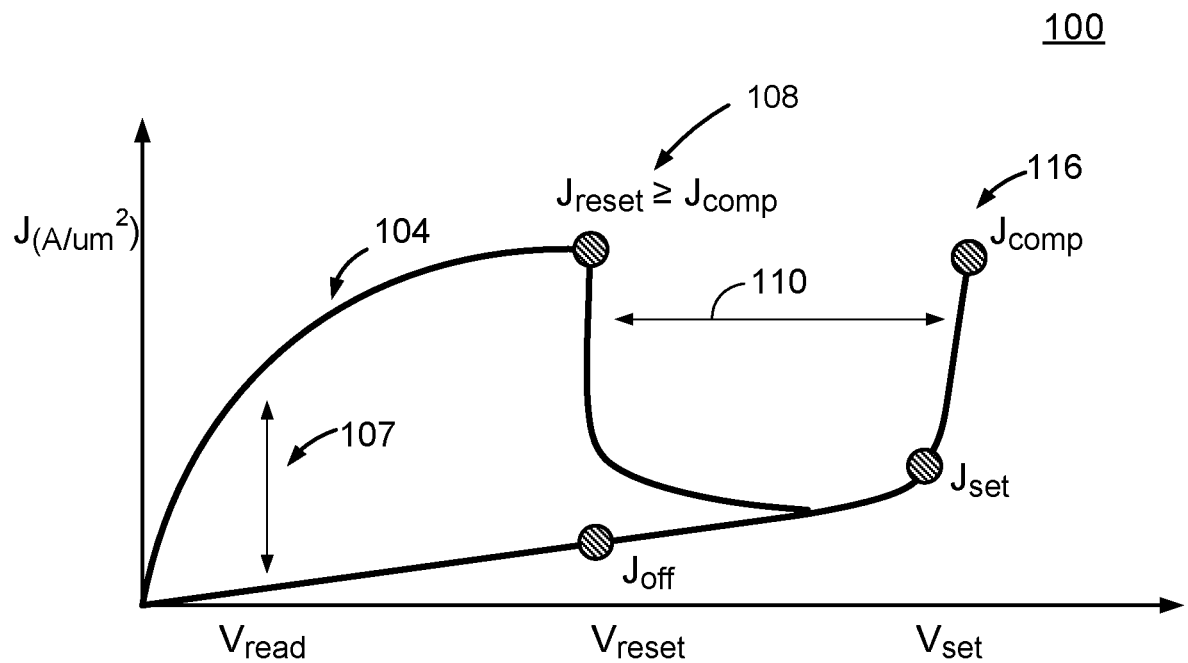
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM) in memory and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave components, and so forth, although claimed subject matter is not limited in scope in these respects. In this context, a CEM switch, for example, may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a CEM-based device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition.

In implementations, a CEM may comprise one or more "d-block" elements from of the periodic table of the elements, such as transition metals, transition metal compounds, one or more transition metal oxides (TMOs), for example. CEM devices may also be implemented utilizing one or more "f-block" elements of the periodic table of the elements, such as rare earth elements, oxides of rare earth elements, oxides comprising one or more rare earth transitional metals, perovskites, yttrium, and/or ytterbium, or any other compounds comprising metals from the lanthanide or actinide series of the periodic table of the elements, for example, and claimed subject matter is not limited in scope in this respect. Accordingly, in embodiments, a CEM may comprise oxides of one or more d-block elements and/or oxides of one or more f-block elements, having an atomic concentration of at least 85.0%, for example, with the remaining portion of the CEM comprising a dopant such as, for example, carbon or nitrogen. Thus, in this context, as the term is used herein, a d-block element means an element comprising Scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. Also in this context, a CEM formed from or comprising an "f-block" element of the periodic table of the elements means a CEM comprising a metal or metal oxide from f-block of the periodic table of the elements, which includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (CO, einsteinium (Es), fermium (Fm), mendelevium (Md), nobelium (No) or lawrencium (Lr), or any combination thereof.

FIG. 1A is an illustration of an embodiment 100 of a current density versus voltage profile of a device formed from a correlated electron material. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM device to a relatively low-impedance memory state. Conversely, application of a voltage $V_{reset}$ and a current density $J_{reset}$ may bring about a transition of the CEM device to a relatively high-impedance memory state. As shown in FIG. 1A, reference designator 110 illustrates the voltage range that may separate $V_{set}$ from $V_{reset}$. Following placement of the CEM device into a high-impedance state or a low-impedance state, the particular state of the CEM device may be detected by application of a voltage $V_{read}$ (e.g., during a read operation) and detection of a current or current density at terminals of the CEM device (e.g., utilizing read 107).

According to an embodiment, the CEM device characterized in FIG. 1A may comprise any transition metal oxide (TMO), such as, for example, perovskites, Mott insulators, charge exchange insulators, and Anderson disorder insulators. In particular implementations, such as described in reference to FIG. 2, a CEM device may be formed from switching materials, such as nickel oxide, cobalt oxide, iron oxide, yttrium oxide, titanium yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells, such as those listed above, may exhibit sufficient impedance switching properties for use in a CEM device. Other implementations may employ other transition metal compounds without deviating from claimed subject matter.

In one aspect, the CEM device of FIG. 1A may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, such as carbonyl (CO), which may establish and/or stabilize variable impedance properties and/or bring about a P-type operation in which a CEM may be more conductive in a low-impedance state (e.g., region 104, described herein). Thus, in another particular example, NiO doped with extrinsic ligands may be expressed as $NiO:L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands, which may bring about or enhance conductivity in a low-impedance state in addition to carbonyl may include: nitrosyl (NO), triphenylphosphine ($PPH_3$), phenanthroline ($C_{12}H_8N_2$), bipyridine ($C_{10}H_8N_2$), ethylenediamine ($C_2H_4(NH_2)_2$), ammonia ($NH_3$), acetonitrile ($CH_3CN$), Fluoride (F), Chloride (Cl), Bromide (Br), cyanide (CN), sulfur (S), and others.

In this context, a "P-type" doped CEM as referred to herein means a first type of CEM comprising a particular molecular dopant that exhibits increased electrical conductivity, relative to an undoped CEM, if the CEM is operated in a low-impedance state, such as the low-impedance state indicated by region 104 of FIG. 1A described herein. Introduction of a substitutional ligand, such as CO and $NH_3$, may operate to enhance the P-type nature of a NiO CEM. Accordingly, an attribute of P-type operation of a CEM may include, at least in particular embodiments, an ability to tailor or customize electrical conductivity of a CEM, operated in a low-impedance state, by controlling an atomic concentration of a P-type dopant in a CEM. In particular embodiments, an increased atomic concentration of a P-type dopant may bring about increased electrical conductivity of a CEM, although claimed subject matter is not limited in this respect.

In another embodiment, the CEM device of FIG. 1A may comprise other transition metal oxide variable impedance materials, having an atomic concentration of at least 85.0%, for example, with the remaining portion of the CEM comprising a dopant such as, for example, carbon or nitrogen (or nitrogen-containing or carbon-containing ligands), though it should be understood that these are exemplary only and are not intended to limit claimed subject matter. Nickel oxide (NiO) is disclosed as one particular TMO. NiO materials discussed herein may be doped with extrinsic nitrogen-containing ligands, which may stabilize variable impedance properties. In particular, NiO variable impedance materials disclosed herein may include nitrogen-containing molecules of the form $C_xH_yN_z$ (wherein x≥0, y≥0, z≥0, and wherein at least x, y, or z comprise values >0) such as: ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. NiO variable impedance materials disclosed herein may include members of an oxynitride family ($N_xO_y$, wherein x and y comprise whole numbers, and wherein x≥0 and y≥0 and at least x or y comprise values >0), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a relatively high-impedance state, for example, responsive to a Mott transition. This may correspond to point 108 of the voltage versus current density profile of FIG. 1A. At, or suitably near this point, electrons are no longer screened and become localized near the metal ion. This correlation may result in a strong electron-to-electron interaction potential, which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally-applied compliance current may, in some embodiments, also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device that may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled substantially in accordance with expression (1) as follows:

$$\lambda_{TF} n^{\frac{1}{3}} = C \sim 0.26 \qquad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled substantially in accordance with expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled substantially in accordance with expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

In which $A_{CEM}$ is a cross-sectional area of a CEM device; and $J_{reset}(V_{MI})$ may represent a current density through the CEM device to be applied to the CEM device at a threshold voltage $V_{MI}$, which may place the CEM device into a relatively high-impedance state.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, responsive to a sufficient quantity of electrons injected, the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $Ni_xO_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of a lattice structure, for example, comprising the transition metal, transition metal compound, transition metal oxide, or comprising a combination thereof. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., $NiO:CO$ or $NiO:NH_3$), thereby permitting the nickel oxide material to switch to exhibiting a substantially dissimilar impedance property, such as a high-impedance property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+(e.g., $Ni^{2+}$ in a material, such as $NiO:CO$ or $NiO:NH_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as $Ni^{1+} + Ni^{3+}$ as shown in expression (4), which may bring about, for example, a relatively high-impedance state during operation of the CEM device. In an embodiment, a dopant such as a carbon-containing ligand, carbonyl (CO) or a nitrogen-containing ligand, such as an ammonia molecule ($NH_3$), may permit sharing of electrons during operation of a CEM device so as to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits nickel-based CEM to return to a relatively low-impedance state.

In embodiments, depending on a molecular concentration of $NiO:CO$ or $NiO:NH_3$, for example, which may vary from values approximately in the range of an atomic concentration of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of an electron back-donating material, such as $NiO:CO$ or $NiO:NH_3$ and other materials present in the CEM device, as well as other process variations, and claimed subject matter is not limited in this respect.

Also in this context, an "electrode" as used herein means a planar structure comprising a surface that enables materials, such as materials operating to provide an electrical function, to be deposited or placed on or over the electrode. For example, in a CEM-based device, a metallic electrode may comprise a significant atomic concentration of metal, may operate to convey an electrical current to the CEM-based device in contact with the conductive metallic electrode. In embodiments, a metallic electrode may be constructed via a deposition process and may comprise a titanium or titanium-based material, such as titanium nitride (TiN). In embodiments, a metallic electrode may comprise one or more d-block or f-block elements other than titanium, such as platinum, copper, aluminum, cobalt, nickel, tungsten, tungsten nitride, cobalt silicide, ruthenium, ruthenium oxide, chromium, gold, palladium, indium tin oxide, tantalum, silver, iridium, or iridium oxide or any combination thereof, and claimed subject matter is not limited to any particular composition of conductive substrate material. It should be noted, however, that claimed subject matter is intended to embrace metallic electrodes of the form $ML:L_{dopant}$, in which "M" indicates a metal ion, such as a d-block or f-block element, "L" indicates a dominant ligand, such as oxygen in an NiO molecule, and in which $L_{dopant}$ comprises a dopant ligand, such as carbonyl (CO) in an $NiO:CO$ complex and $NH_3$ in $NiO:NH_3$ complex, just to name two possible examples.

Also in this context, a "layer" as the term is used herein, means a planar surface which, in aggregation with one or more additional layers on and/or beneath a particular layer, form a structure, such as a structure comprising a semiconductor wafer. Thus, for example, a semiconductor wafer may be formed by accumulating or aggregating two or more layers deposited utilizing the suitable deposition process. In embodiments, semiconductor structures may comprise any number of layers, such as two layers, five layers, 10 layers, 50 layers, or a number of layers that may number into the thousands and beyond. In certain embodiments, a semiconductor structure, such as a semiconductor wafer, for example, may comprise substrate layers, CEM layers, layers comprising one or more conductive traces to traverse an area of the semiconductor structure, layers comprising insulative material, as well as layers forming transistors, diodes, switches, passive circuit elements (e.g., capacitors, inductors, and so forth), interconnections between or among circuits, and a wide variety of layers to perform additional electrical functions, and claimed subject matter is not limited in this respect.

Further, in this context, a substrate may correspond to a first layer, or a first group of layers, of a wafer. Thus, for example, a transistor, logic device, diode, sensor, for example, may operate on or over a substrate or first layer of a wafer. At a second layer of a wafer, or at a second group of layers of a wafer, one or more conductive traces to route signals may disposed, as well as one or more interconnects, such as optical interconnects, for example, may be positioned. Particular devices, such as CEM devices, operating on or over first layer of a wafer (or first group of layers of a wafer) may be physically separated and/or electrically isolated by a second layer of a wafer (or second group of layers of a wafer) by an insulating material, such as silicon nitride. Accordingly, in this context, a "wafer," as the term is used herein, means a multi-layered collection of devices, such as CEM devices, which may perform a number of logic, switching, access, RF, signal reception and/or signal transmission, or other electrical and/or logic functions, utilizing a plurality of layers forming a structure comprising a fabricated wafer.

In particular embodiments, a deposition process may utilize two or more precursors to deposit components of, for example, NiO:CO or NiO:NH$_3$, for example, onto a conductive metallic electrode positioned over a substrate. In an embodiment, a CEM film may be deposited, for example, utilizing separate precursor molecules, AX and BY, substantially in accordance with expression (6a), below:

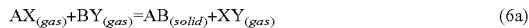

$$AX_{(gas)} + BY_{(gas)} = AB_{(solid)} + XY_{(gas)} \quad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate (YTiO$_3$).

In embodiments, "X" of expression (6a) may comprise a ligand, such as an organic ligand, comprising amidinate (AMD), dicyclopentadienyl (Cp)$_2$, diethylcyclopentadienyl (EtCp)$_2$, Bis(2,2,6,6-tetramethylheptane-3,5-dionato) ((thd)$_2$), acetylacetonate (acac), bis(methylcyclopentadienyl) ((CH$_3$C$_5$H$_4$)$_2$), dimethylglyoxime (dmg)$_2$, 2-aminopent-2-en-4-onato (apo)$_2$, (dmamb)$_2$ where dmamb=1-dimethylamino-2-methyl-2-butanolate, (dmamp)2 where dmamp=1-dimethylamino-2-methyl-2-propanolate, Bis(pentamethylcyclopentadienyl) (C$_5$(CH$_3$)$_5$)$_2$ and carbonyl (CO)$_4$. Accordingly, in some embodiments, nickel-based precursor AX may comprise, for example, nickel amidinate (Ni(AMD)), nickel dicyclopentadienyl (Ni(Cp)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni(CH$_3$C$_5$H$_4$)$_2$, Nickel dimethylglyoxime (Ni(dmg)$_2$), Nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, Bis(pentamethylcyclopentadienyl) nickel (Ni(C$_5$(CH$_3$)$_5$)$_2$, and nickel carbonyl (Ni(CO)$_4$), just to name a few examples. In expression (6a), precursor "BY" may comprise an oxidizer, such as oxygen (O$_2$), ozone (O$_3$), nitric oxide (NO), hydrogen peroxide (H$_2$O$_2$), just to name a few examples. In other embodiments as will be described further herein, plasma may be used with an oxidizer to form oxygen radicals.

However, in particular embodiments, a dopant comprising an electron back-donating material in addition to precursors AX and BY may be utilized to form films utilized in a CEM device. An additional dopant ligand comprising an electron back-donating material, which may co-flow with precursor AX, may permit formation of electron back-donating compounds, substantially in accordance with expression (6b), below. In embodiments, a dopant comprising an electron back-donating material, such as ammonia (NH$_3$), methane (CH$_4$), carbon monoxide (CO), or other material may be utilized, as may other ligands comprising carbon or nitrogen or other dopants comprising electron back-donating materials listed above. Thus, expression (6a) may be modified to include an additional dopant ligand comprising an electron back-donating material substantially in accordance with expression (6b), below:

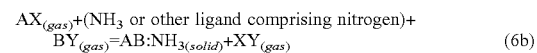

$$AX_{(gas)} + (NH_3 \text{ or other ligand comprising nitrogen}) + BY_{(gas)} = AB:NH_{3(solid)} + XY_{(gas)} \quad (6b)$$

It should be noted that concentrations, such as atomic concentration, of precursors, such as AX, BY, and NH$_3$ (or other ligand comprising nitrogen) of expressions (6a) and (6b) may be adjusted so as to bring about a final atomic concentration of nitrogen or carbon dopant comprising an electron back-donating material in a fabricated CEM device, such as in the form of ammonia (NH$_3$) or carbonyl (CO) comprising an atomic concentration of between approximately 0.1% and 15.0%. However, claimed subject matter is not necessarily limited to the above-identified precursors and/or atomic concentrations. Rather, claimed subject matter is intended to embrace all precursors utilized used in CEM film deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices. In expressions (6a) and (6b), "BY" may comprise an oxidizer, such as oxygen (O$_2$), ozone (O$_3$), nitric oxide (NO), hydrogen peroxide (H$_2$O$_2$), just to name a few examples. In other embodiments, plasma may be used with an oxidizer (BY) to form oxygen radicals. Likewise, plasma may be used with the doping species comprising an electron back-donating material to form an activated species to control the doping concentration of a CEM.

In particular embodiments, such as embodiments utilizing deposition techniques, a metallic electrode may be exposed to precursors, such as AX and BY, as well as dopants comprising electron back-donating materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which a deposition technique utilizes NiO:NH$_3$, for example, is performed, chamber temperature ranges approximately in the range of 20.0° C. and 400.0° C. may be utilized. Responsive to exposure to precursor gases (e.g., AX, BY, NH$_3$, or other ligand comprising nitrogen), such gases may be purged from the heated chamber for durations approximately in the range of 0.5 seconds to 180.0 seconds. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression 6(a)) or a single three-precursor cycle (e.g., AX, NH$_3$, CH$_4$, or other ligand comprising nitrogen, carbon or other dopant comprising an electron back-donating material, and BY, as described with reference to expression 6(b)) utilizing deposition technique may bring about a CEM device film comprising a thickness approximately in the range of 0.6 Å to 5.0 Å per cycle). Accordingly, in an embodiment, to form a CEM device film comprising a thickness of approximately 500.0 Å utilizing a deposition process in which CEM films comprise a thickness of approximately 0.6 Å, 800-900 cycles, for example, may be utilized. In another embodiment, utilizing a film deposition process in which films comprise approximately 5.0 Å, 100 two-precursor cycles, for example. It should be noted that deposition processes may be utilized to form CEM device films having other thicknesses, such as thicknesses approximately in the range of 1.5 nm and 150.0 nm, for example, and claimed subject matter is not limited in this respect.

In particular embodiments, responsive to one or more two-precursor cycles (e.g., AX and BY), or three-precursor cycles (AX, NH$_3$, CH$_4$, or other ligand comprising nitrogen, carbon or other dopant comprising an electron back-donating material and BY), of a deposition technique, a CEM device film may undergo in situ annealing, which may permit improvement of film properties or may be used to incorporate a dopant comprising an electron back-donating material, such as in the form of carbonyl or ammonia, in the CEM device film. In certain embodiments, a chamber may be heated to a temperature approximately in the range of 20.0° C. to 1000.0° C. However, in other embodiments, in situ annealing may be performed utilizing chamber temperatures approximately in the range of 100.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, V$_{reset}$ may occur at a voltage approximately in the range of 0.1 V to 1.0 V, and V$_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

Figure 1B:
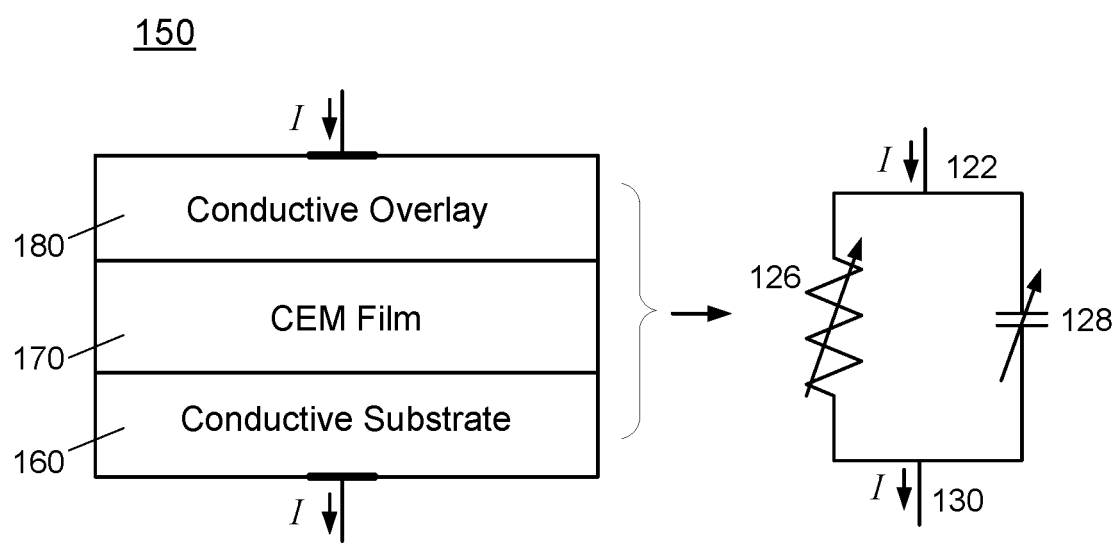
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as a device comprising a metallic electrode 160, CEM 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM and claimed subject matter is not limited in this respect.

Table 1, below, depicts an example truth table for an example variable impedance device, such as the device of embodiment 150.

TABLE 1

Correlated Electron Switch Truth Table

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In an embodiment, Table 1 shows that a resistance of a variable impedance device, such as the device of embodiment 150, may transition between a low-impedance state and a substantially dissimilar, high-impedance state as a function at least partially dependent on a voltage applied across a CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across a CEM device.

Figure 2A:
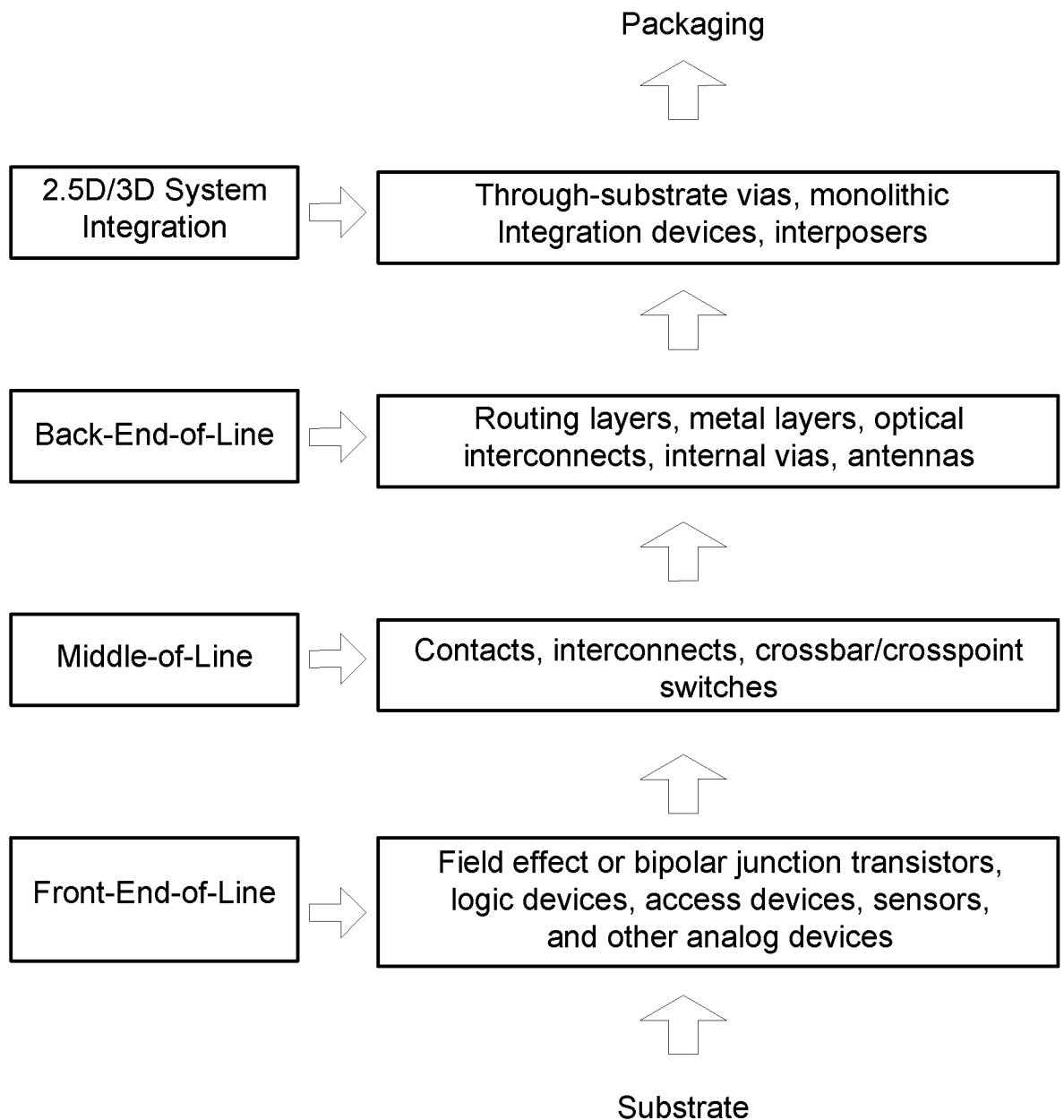
FIGS. 2A-2B is a diagram showing devices that may be formed from correlated electron materials (CEMs) at various fabrication stages of a wafer fabrication process according to one or more embodiments.

FIG. 2A is a diagram showing devices that may be fabricated from correlated electron materials (CEMs) at various stages of a wafer fabrication process according to one or more embodiments. At the left side of FIG. 2A, fabrication stages of "substrate," "front end of line," "middle of line," "back end of line," and "2.5D/3D system integration" correspond to stages of an overall wafer fabrication process. Thus, a complex device may be fabricated beginning at a substrate stage and ending at a packaging stage. In embodiments, CEM devices may be fabricated at a frontend-of-line, middle-of-line, back-end-of-line, and at the 2.5D/3D system integration stage of a wafer fabrication process.

At a front-end-of-line stage of a wafer fabrication process, CEM devices may be constructed on or over a substrate to form active devices having logic properties that could replace certain active devices, such as field-effect or bipolar junction transistors, logic devices, access devices, sensors, and other analog devices, for example. At a middle-of-line stage of a wafer fabrication process, CEM devices may be constructed on or over front-end-of-line devices to form contact and switching devices, for example. At a back-end-of-line stage of a wafer fabrication process, CEM devices may be constructed on or over middle-of-line devices to form routing layers, metal layers, optical interconnects, internal vias, antenna elements, for example. At a 2.5D/3D system integration stage of a wafer fabrication process, CEM devices may be constructed on or over back-end-of-line devices to form through-substrate vias, interposers, which may assist in monolithic integration of packages comprising CEM devices.

Figure 2B:
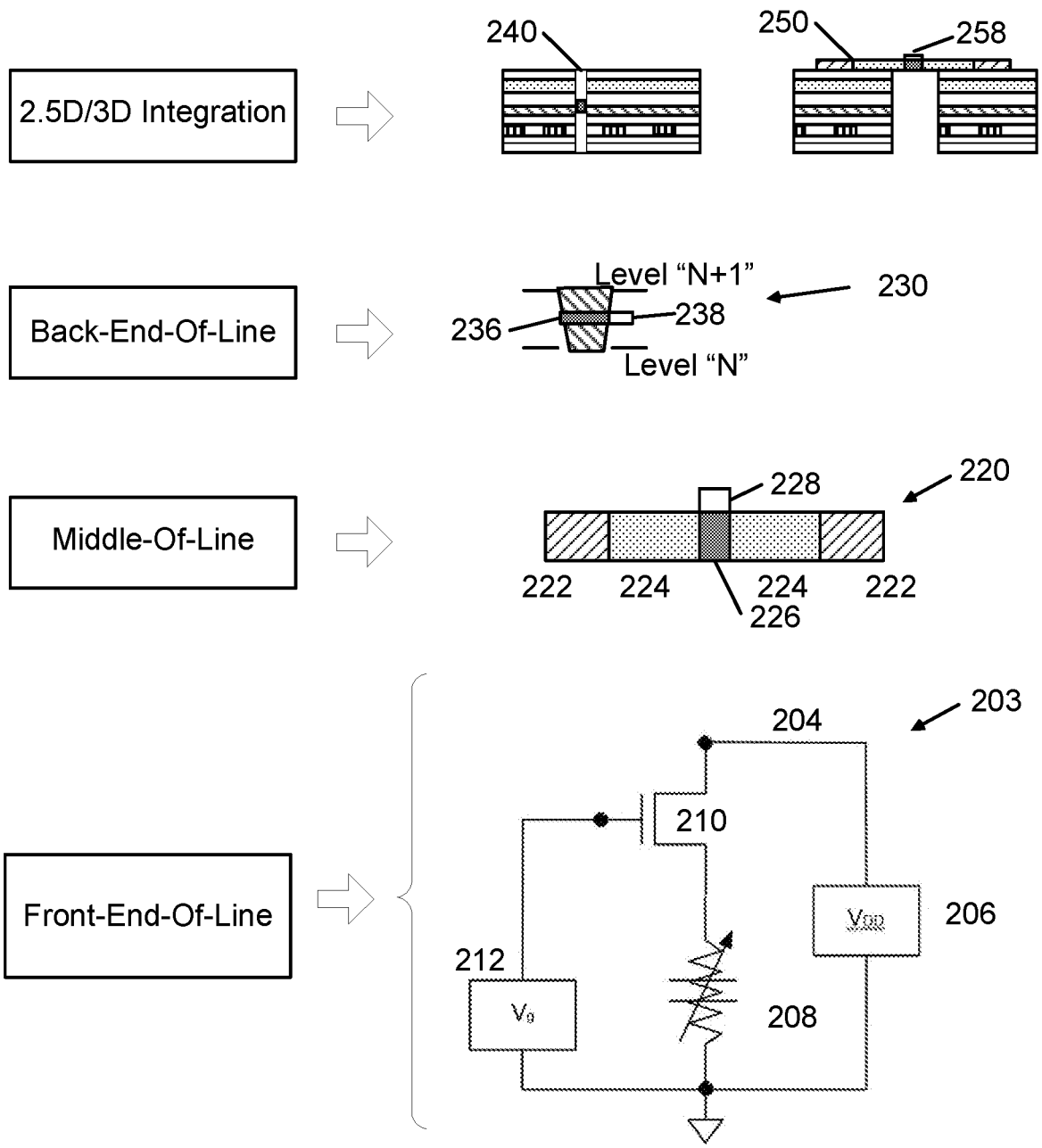
Figure 2C:
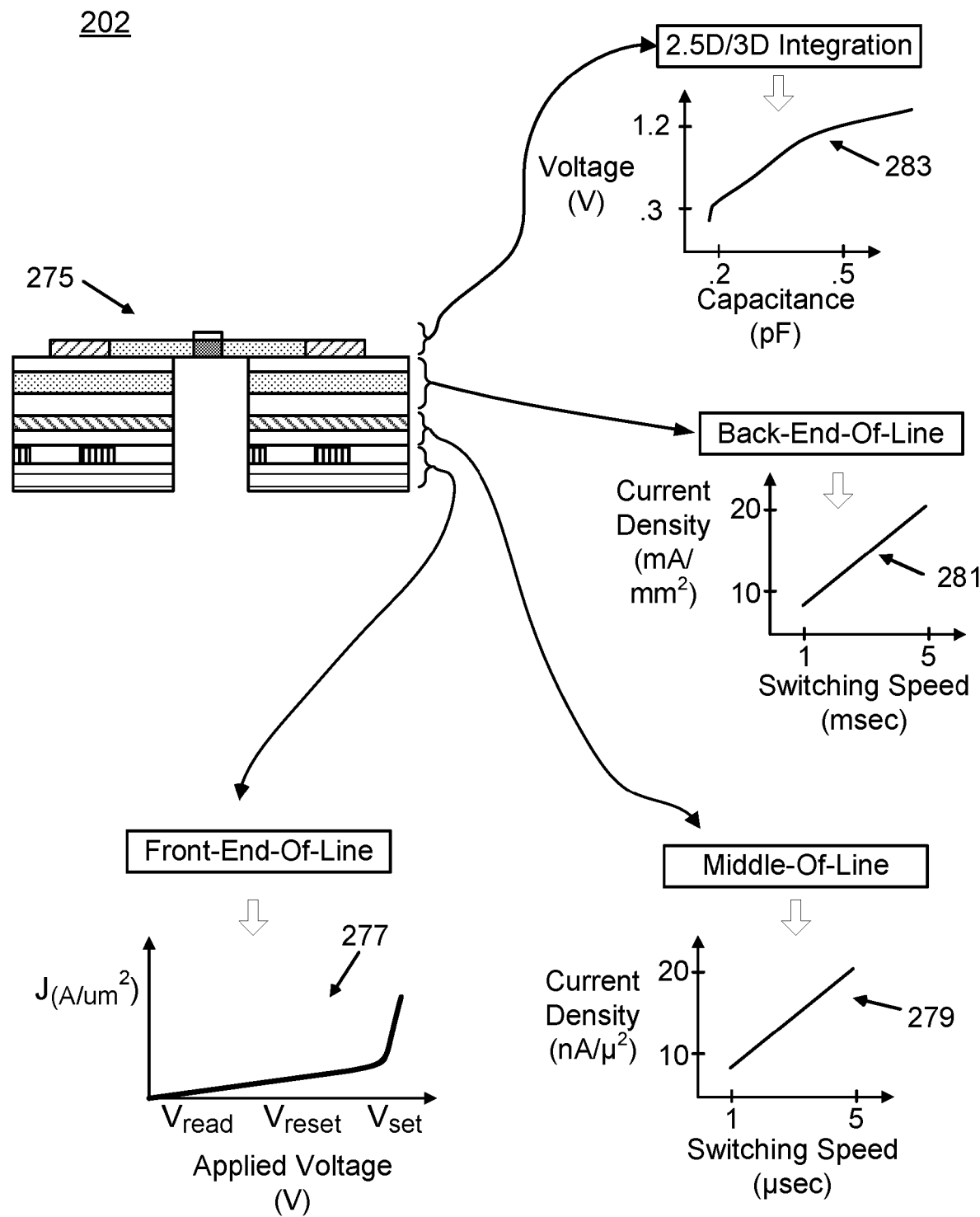
FIG. 2C is a diagram showing example performance profiles of CEM devices formed at various fabrication stages of a wafer fabrication process according to one or more embodiments.

FIG. 2B is a diagram showing certain devices listed in FIG. 2A that may be fabricated from CEMs at various stages of a wafer fabrication process according to one or more embodiments. In particular embodiments, a CEM device may be doped or dimensioned to permit the CEM devices to operate as described by one or more performance profiles appropriate for a particular stage of a wafer fabrication process. In this context, a "performance profile," as discussed further in reference to FIG. 2C, provided as an example of a performance profile, means a characteristic of one or more devices responsive to an input signal. For example, a performance profile may describe voltage versus current characteristics exhibited by a CEM device, such as shown in FIG. 1A. In one possible example, which may correspond to a CEM utilized as a switching device, a relatively high concentration of a P-type dopant may be utilized to bring about a substantial current flow responsive to an applied voltage. In such an instance, a performance profile may describe or characterize a CEM as exhibiting a relatively steep current slope with respect to an applied voltage in which a small increase in an applied voltage gives rise to a large increase in electrical current flowing through the device. In another example, in which a CEM may be deployed in a transistor circuit, a relatively low concentration of a P-type dopant may be utilized to bring about a smaller and more easily controlled current flow responsive to an applied voltage. In such an instance, a performance profile describing or characterizing such behavior may indicate that a small increase in an applied voltage brings about a comparatively small increase in current flowing through a CEM device. It should be noted that although performance profiles are described as depicting current/voltage characteristics exhibited by a CEM device, embodiments of claimed subject matter may include performance profiles depicting characteristics of numerous other performance parameters. For example, performance profiles may describe or characterize leakage current versus an applied voltage exhibited by a CEM device, capacitance versus frequency of an input signal, output signal power versus frequency of an input signal, and so forth, and claimed subject matter is not limited in this respect.

It may be appreciated that, at times, it may be desirable to determine if CEM-based devices can be configured or adapted to perform electrical functions that exhibit specified application performance parameters. Accordingly, in this context, specified application performance parameters means desired or required performance parameters of a CEM device or a set of devices comprising one or more CEM-based devices. For example, a possible specified application performance parameter may refer to a required current versus voltage profile of, for example, a memory access device. In another possible example, a specified application performance parameter may refer to a switching speed of a CEM-based switch, an upper threshold of parasitic capacitance, a specified maximum time period required to access a storage device, and so forth, and claimed subject matter is intended to embrace all desired or required performance parameters of CEM devices or devices that include one or more CEMs.

Thus, in particular implementations, specified application performance parameters may be enabled by modifying and/or adjusting parameters of equipment utilized to form CEM device or devices utilizing one or more CEMs. In one possible example, a CEM for use in a power transistor application may be realized by forming a CEM device of sufficient cross-sectional area to permit desired or required power-handling capability at an output stage. In another possible example, a CEM for use in a memory storage application may be realized by forming CEM devices having leakage current of less than 100 nA/micron of device gate width at voltages of less than approximately 1.2 V. Thus, in this context, a physical dimensional parameter of a CEM means an aspect of a CEM device's physical size, such as cross-sectional area, length, or other measurable dimensional characteristic or aspect of a CEM device. In particular embodiments, a length of a CEM used in a CEM device may range from approximately 2.0 nm to approximately 200.0 nm, although claimed subject matter is not limited in this respect.

In addition to physical dimensional parameters of a CEM, a compositional parameter of the CEM may be adjusted as an approach toward enabling a CEM to operate in accordance with required or desired specified application performance parameters. In one possible example, a CEM for use in a low-loss switching operation may comprise a CEM having a relatively high conductivity. In such an instance, a CEM may be heavily doped (such as doped with an atomic concentration of approximately 15.0% of a P-type dopant) so as to meet or exceed specified application performance parameters for low loss switching. Thus, in this context, a "compositional parameter" means a material parameter of a CEM that permits the CEM to meet, for example, a specified application performance parameter. In addition to dopant concentration, compositional parameters of a CEM may include selection of a transition metal and/or transition metal oxide utilized to fabricate a CEM, selection of a dopant species, and so forth, and claimed subject matter is not limited in this respect.

Accordingly, in a possible example of a device fabricated at a front-end-of-line stage of a wafer fabrication process, a correlated electron material may be utilized to form a compound transistor circuit, such as compound transistor circuit 203 shown schematically in FIG. 2B. In an embodiment, a voltage source, such as voltage source 206 ($V_{DD}$) may be applied across transistor 210 and a CEM device, such as CEM device 208. Gate voltage 212 ($V_g$) may be applied to a gate of an NMOS transistor, such as transistor 210, in an embodiment. In particular embodiments, a CEM device may operate as a logic device having a gate width of less than approximately 28.0 nm. A CEM-based logic devices may exhibit leakage current of less than 100 nA/micron of device with at voltages less than approximately 1.2 V. It should be understood, however, that these are merely examples of device performance parameters, and claimed subject matter is not limited in this respect.

In another possible example of a device fabricated at a front-end-of-line stage of a wafer fabrication process, a correlated electron material may be utilized as a memory device. In such an instance, a CEM device may be set to a high-impedance state, which may correspond to a first logic state. A CEM device may be set to a low-impedance state, which may correspond to a second logic state. Numerous additional CEM devices may be fabricated at a front-end-of-line types of a wafer fabrication process, such as those described with reference to FIG. 2A, and claimed subject matter is not limited in this respect.

In a possible example of a device formed at a middle-of-line stage of a wafer fabrication process, a CEM may be utilized to form a three-terminal device, such as three-terminal device 220. In an embodiment, three-terminal device 220 may be utilized as an logic switch comprising a switching region, such as switching region 226, formed between conductive regions 224. To bring about a switching function, switching region 226 may be doped differently from regions 224, for example. Regions 222 may be formed as electrode terminals, and gate terminal 228 may be coupled to switching region 226. In an embodiment, three-terminal device 220 may exhibit a particular high-impedance state/low-impedance state detectable at electrode terminals 222. For example, a particular voltage applied to gate terminal 228 may induce a Mott transition or Mott-like transition of material in switching region 226 to change a CEM state from a conductive or low impedance state to an insulative or high impedance state. Accordingly, a middle-of-line CEM device coupled to one or more transistor circuits, such as transistor circuit 203, may permit dynamic reconfiguring of the transistor circuit responsive to applying an appropriate voltage to gate terminal 228.

It should be noted that although three-terminal device 220 depicts a single input and a single output, separated by intervening switching region 226, particular embodiments may form a switching device in which switching region 226 separates a single input from a multiple output ports. In such embodiments, inducing a Mott transition or Mott-like transition of switching region 226 may restrict current flow from the single input to the multiple output ports of the switching device. Thus, one or more output ports of a switch may be coupled to a number of transistor circuits, which may be similar to transistor circuit 203, to permit activation/deactivation of a plurality of transistor circuits.

A CEM-based device may be formed to operate as a switchable via at a back-end-of-line stage of a wafer fabrication process. For example, via 230, which may operate to permit electrical currents to pass between a first layer of a wafer, such as layer "N," and a second layer, such as layer "N+1." In a manner similar to that of three-terminal device 220, conductivity of via 230 may be controlled utilizing gate terminal 238. Thus, in a particular embodiment, via 230 may be set to a relatively high-impedance state by way of applying a voltage to gate terminal 238, which may bring about a Mott transition or a Mott-like transition within switching region 236. Accordingly, current flow from layer "N" to layer "N+1" may be interrupted by applying an appropriate voltage signal to gate terminal 238. It should be noted that although gate terminal 238 is shown as comprising a gate contact to one side of switching region 236, gate terminal 238 may comprise multiple contacts at two or more sides of switching region 236. In other embodiments, gate terminal 238 may resemble a torus or a disk, which may partially or completely surround switching region 236.

In addition, a CEM-based switching device may be fabricated at a 2.5D/3D system integration stage of a wafer fabrication process to operate as a through-substrate via. As shown in FIG. 2B, through-substrate via 240, may operate to electrically couple signals among two or more layers of a wafer and, for example, to extend through a substrate layer of a wafer. Also at a 2.5D/3D system integration stage of a wafer fabrication process, a CEM device may operate as an interposer, such as interposer 250, which may operate to convey electrical signals between two or more wafers of a semiconductor package. As shown in FIG. 2B, gate 258 of interposer 250 may be coupled to a switching region of a CEM, which may operate to interrupt current flow between wafers, for example. It should be noted that many additional devices and/or circuits are possible utilizing CEMs at various stages of a wafer fabrication process, such as a front-end-of-line stage, a middle-of-line stage, a back-end-of-line stage, and a 2.5D/3D system integration stage, and claimed subject matter is not limited to the above-mentioned examples. In particular embodiments in which a CEM device is utilized to perform a switching function, a CEM device may exhibit a resistivity below approximately 1.6 microohms-cm ($\mu\Omega$-cm) in a low-impedance state and a resistivity above approximately 16.0 microohms-cm in a high-impedance state.

FIG. 2C is a diagram showing example performance profiles of CEM devices formed at various stages of a wafer fabrication process according to an embodiment 202. In FIG. 2C, wafer 275 comprises one or more CEM devices formed at a front-end-of-line stage, a middle-of-line stage, a back-end-of-line stage, and a 2.5D/3D system integration stage of a wafer fabrication process. In one example, active and/or gain-producing devices, such as transistor 210 coupled to CEM device 208 of FIG. 2B, for example, which may be formed at a front-end-of-line fabrication stage. Accordingly, as indicated by performance profile 277, for example, an access device coupled to one or more CEM-based memory cells formed at a front-end-of-line stage of a wafer fabrication process may permit an electrical current to flow responsive to an applied voltage. Of course, although performance profile 277 indicates a two-dimensional current versus applied voltage, performance profiles may characterize additional parameters also in response to an input signal frequency. For example, a performance profile indicating electrical parameters such as gain, phase noise, input and/or output impedance, noise figure, parasitic capacitance, and a variety of other electrical parameters may be characterized by a multi-dimensional performance profile, and claimed subject matter is not limited in this respect. It should be additionally noted that a wide variety of additional types of circuits may be formed at a front-end-of-line fabrication stage, such as memory and/or logic devices, access devices, sensors, and other analog devices, for example, and claimed subject matter is not limited in this respect.

At a middle-of-line stage of a wafer fabrication process, which may represent a stage at which forming access devices coupled to CEM-based memory cells may be difficult, a performance profile for devices fabricated at such a stage may depict behavior for switching devices, such as three-terminal device 220 of FIG. 2B. Accordingly, as indicated by performance profile 279, for example, a switching device formed at a middle-of-line fabrication stage may exhibit a switching speed of between approximately 1.0 and 5.0 $\mu$s responsive to an input current density of between approximately 10.0 and 20.0 nA/$\mu$m$^2$. In a similar manner, as indicated by performance profile 281, for example, a switching device formed at a back-end-of-line fabrication stage, which may be characterized by a somewhat larger current-carrying characteristic (e.g., in relation to a device fabricated at a middle-end-of-line fabrication stage) may exhibit a switching speed of between approximately 1.0 ms and 5.0 ms responsive to an input current density of between 10.0 and 20.0 mA/mm². However, although performance profiles 279 and 281 indicate two-dimensional current density versus switching speed characteristics, performance profiles of devices fabricated at middle or end of line of a wafer fabrication process may characterize additional parameters and claimed subject matter is not limited in this respect.

At a 2.5D/3D system integration stage of a wafer fabrication process, a CEM device may be fabricated to permit integration of output signals among two or more wafers prior to packaging. For example, as described with reference to FIG. 2B, an interposer, such as interposer 250, for example, may exhibit stray or parasitic capacitance responsive to an input voltage. Accordingly, for example, performance profile 283 may indicate parasitic or stray capacitance of an interposer that varies from between 0.2 pF at an input signal voltage of 0.3 V to 0.5 pF active input signal voltage of 1.2 V. However, although performance profile 283 indicates a two-dimensional voltage versus capacitance characteristic, performance profiles for devices fabricated a 2.5D/3D system integration stage of a wafer fabrication process may characterize additional parameters, and claimed subject matter is not limited in this respect.

Figure 3A:
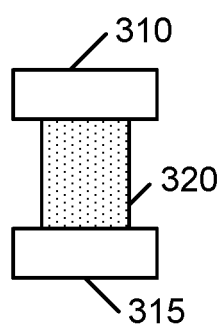
FIGS. 3A-3E illustrate various CEM devices disposed between layers of a wafer according to embodiments.
Figure 3B:
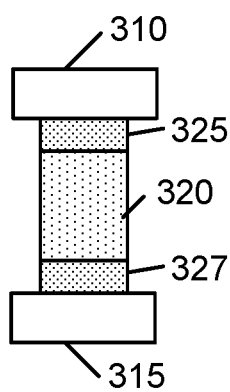
Figure 3C:
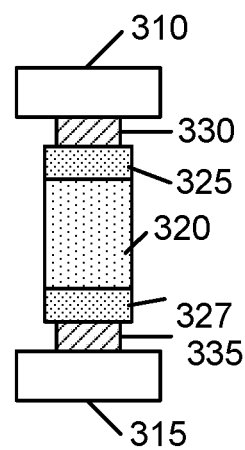
Figure 3D:
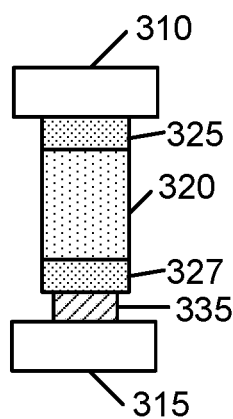
Figure 3E:
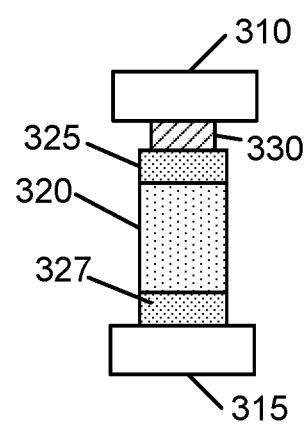

FIGS. 3A-3E illustrate various CEM devices disposed between layer of a wafer according to embodiments 300, 301, 302, 303, and 304. As shown in FIGS. 3A-3E, CEM devices may be fabricated or formed to connect directly with metal layers, to connect directly with metallic electrodes, and/or to connect with metallic vias, for example, and claimed subject matter is intended to embrace all manners of coupling of a CEM to a conductive material. As shown in FIG. 3A, a CEM, such as CEM 320, may be formed between two metal layers, such as metal layers 310 and 315. As shown in FIG. 3B, CEM 320 may be formed between two metallic electrodes, such as metallic electrodes 325 and 327, wherein metallic electrode 325 is placed into contact with metal layer 310, and wherein metallic electrode 327 is placed into contact with metal layer 315. As shown in FIG. 3C, CEM 320, and metallic electrodes 325 and 327, may be formed to contact conductive vias 330 and 335. Conductive via 330 may contact metal layer 310, and conductive via 335 may contact the metal layer 315. As shown in FIGS. 3D and 3E, a first metallic electrode may be formed to contact a metal layer (e.g., metallic electrode 325 of FIG. 3D and/or metallic electrode 327 of FIG. 3E) and a second metallic electrode may be formed to contact a conductive via (e.g., metallic electrode 327 of FIG. 3D and/or metallic electrode 325 of FIG. 3E).

FIGS. 4A-4E illustrate various CEM devices and protective spacers disposed between layer of a wafer according to embodiments 400, 401, 402, 403, and 404. In embodiments 400-404, spacers 440 are formed so as to make direct contact with CEM 420, such as in FIG. 4A, or may be formed to be in direct contact with a CEM as well as t with metallic electrodes, such as in FIGS. 4B-4E. In particular embodiments, such as those described herein, a "spacer" may be formed at an outer boundary of a CEM, such as CEM 420, to fill at least a portion of a trench that separates a first CEM device from a second CEM device, for example. Accordingly, in this context, a "spacer" means a structure that is placed in contact with a CEM device, wherein the spacer operates to insulate or to at least partially isolate adjacent devices from one another, such as CEM devices separated by a trench at a particular layer of a wafer. A spacer may comprise a silicon oxide (SiO) material, for example, or may comprise a silicon nitride (SiN) material, or may comprise any other appropriate insulating material, and claimed subject matter is not limited in this respect.

Figure 4A:
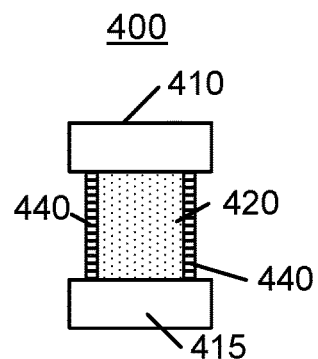
FIGS. 4A-4E illustrate various CEM devices and protective spacers disposed between layers of a wafer according to embodiments.
Figure 4B:
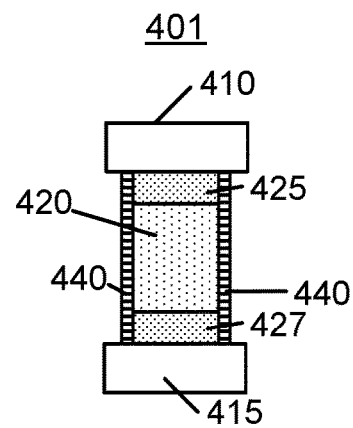
Figure 4C:
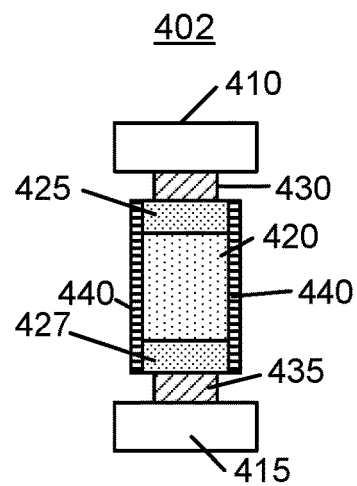
Figure 4D:
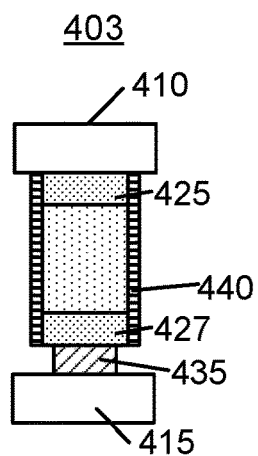
Figure 4E:
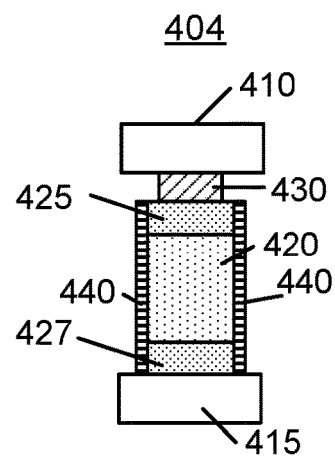

As shown in FIG. 4A, a CEM, such as CEM 420, may be formed between two metal layers, such as metal layers 410 and 415. As shown in FIG. 4B, CEM 420 may be formed between two metallic electrodes, such as metallic electrodes 425 and 427, wherein metallic electrode 425 is placed into contact with metal layer 410, and wherein metallic electrode 427 is placed into contact with metal layer 415. As shown in FIG. 4C, CEM 420, and metallic electrodes 425 and 427, may be formed to contact conductive vias 430 and 435. Conductive via 430 may contact metal layer 410, and conductive vias 435 may contact the metal layer 415. As shown in FIGS. 4D and 4E, a first metallic electrode may be formed to contact a metal layer (e.g., metallic electrode 425 of FIG. 4D and/or metallic electrode 427 of FIG. 4E) and a second metallic electrode may be formed to contact with a conductive via (e.g., metallic electrode 427 of FIG. 4D and/or metallic electrode 425 of FIG. 4E).

Figure 5A:
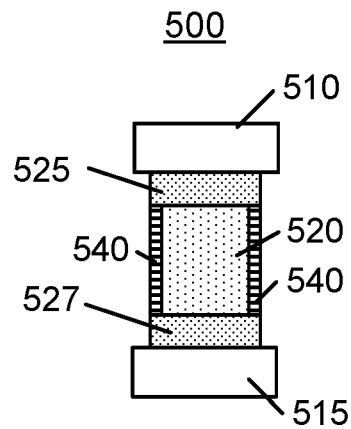
FIGS. 5A-5D illustrate various CEM devices and protective spacers disposed between layers of a wafer according to embodiments.
Figure 5B:
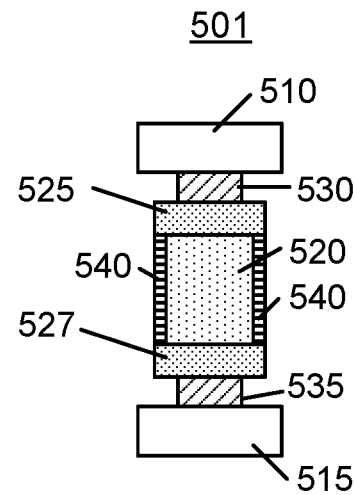
Figure 5C:
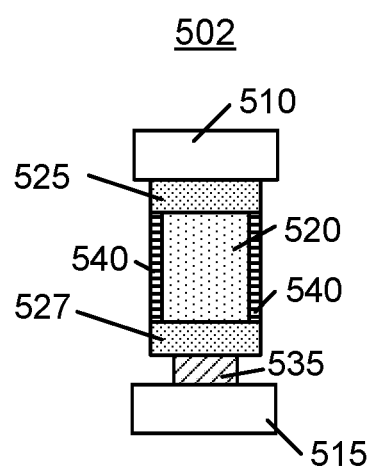
Figure 5D:
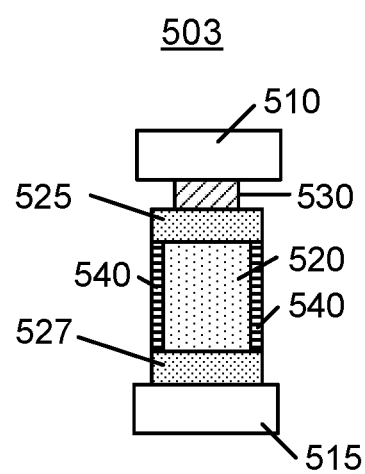

FIGS. 5A-5D illustrate various CEM devices disposed between layer of a wafer according to embodiments 500, 501, 502, 503. In embodiments 500-503, spacers 540 are formed so as to make direct contact with CEM 520 without making significant direct contact with the lateral surfaces of metallic electrodes, such as metallic electrodes 525 and 527. As shown in FIG. 5A, CEM 520, which may be in contact with spacer 540, may be formed between two metallic electrodes, such as metallic electrodes 525 and 527. Metallic electrode 525 may be formed to be in direct contact with metal layer 510, and metallic electrode 527 may be formed to be in direct contact with metal layer 515. As shown in FIG. 5B, CEM 520 and metallic electrodes 525 and 527, may be formed to contact conductive vias 530 and 535. Conductive via 530 may contact metal layer 510, and conductive via 535 may contact the metal layer 515. As shown in FIGS. 5C and 5D, a first metallic electrode may be formed to contact a metal layer (e.g., metallic electrode 525 of FIG. 5C and/or metallic electrode 527 of FIG. 5D) and a second metallic electrode may be formed to contact a conductive via (e.g., metallic electrode 527 of FIG. 5C and/or metallic electrode 525 of FIG. 5D).

Figure 6A:
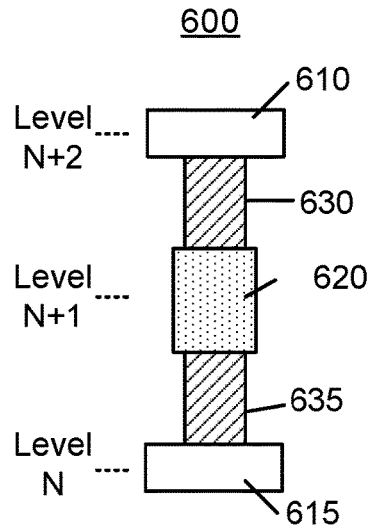
FIGS. 6A-6E illustrate various CEM devices disposed among three layers (N, N+1, and N+2) of a wafer according to embodiments.
Figure 6B:
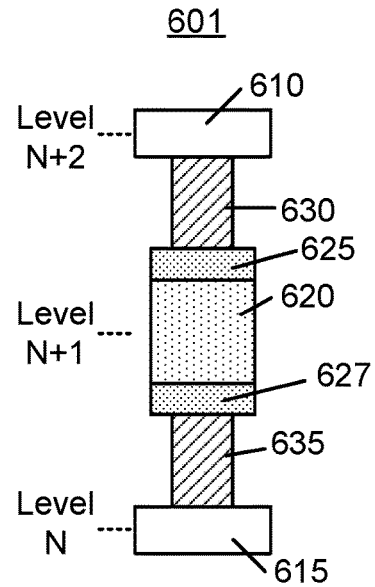
Figure 6C:
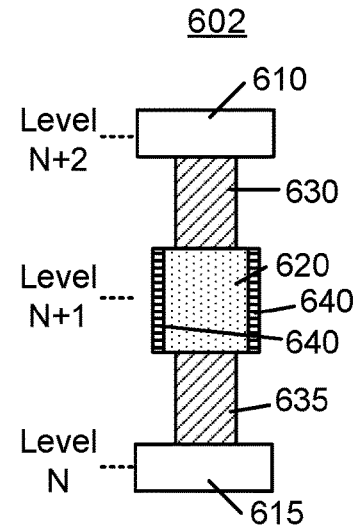
Figure 6D:
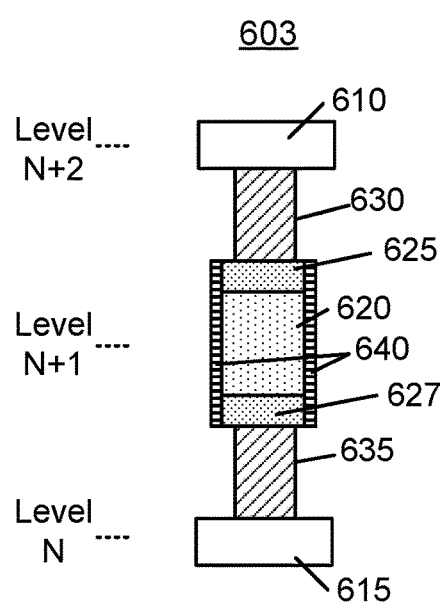
Figure 6E:
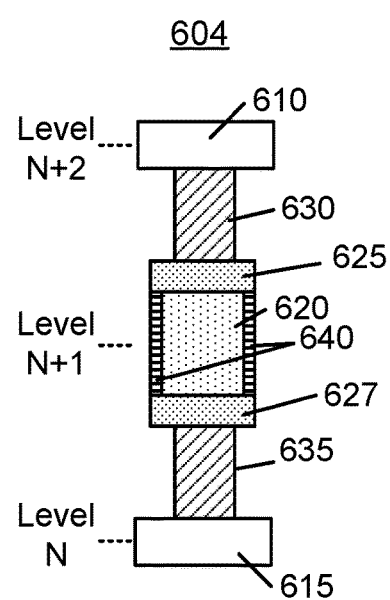

FIGS. 6A-6E illustrate various CEM devices disposed among three layers (N, N+1, and N+2) of a wafer according to embodiments 600, 601, 602, 603, and 604. As shown in FIGS. 6A-6E, and as described with reference to FIGS. 2A and 2B, a CEM device may be utilized at a 2.5D/3D system integration stage of a CEM fabrication process to operate as a through-substrate via (240) to electrically couple signals between or among two or more layers of a wafer. Accordingly, as shown in FIGS. 6A-6E, a CEM device may be fabricated or formed to connect directly with metallic vias and/or to connect directly to metallic electrodes. As shown in FIG. 6A, a CEM, such as CEM 620, may be formed between two elongated metal vias, such as vias 630 and 635, which may operate to conduct electrical current from layer "N," through intervening layer "N+1," to layer "N+2." As shown in FIG. 6B, CEM 620 may be formed between two metallic electrodes, such as metallic electrodes 625 and 627, wherein the metallic electrodes are formed to contact elongated vias 630 and 635. As shown in FIG. 6C, CEM 620, in addition to protective spacer material 640, may be formed between two elongated metal vias, such as elongated vias 630 and 635. As shown in FIG. 6D, CEM 620, in addition to protective spacer material 640, may be formed between two metallic electrodes, such as metallic electrodes 625 and 627, wherein metallic electrode 625 is formed to contact elongated via 630, and wherein metallic electrode 627 is formed to contact elongated metal via 635. As shown in FIG. 6D, protective spacer material 640 may be formed in contact with CEM 620 and metallic electrodes 625 and 627. Metallic electrode 625 may be formed to contact elongated via 630, and metallic electrode 627 may be formed to contact elongated via 635. As shown in FIG. 6E, protective spacer material 640 may be formed in contact with CEM 620. Metallic electrode 625 may be formed to contact elongated via 630 and metallic electrode 627 may be formed to contact elongated via 635.

It should be noted that although the devices shown in embodiments 600-604 are described as extending between three layers of a wafer, such as local N, N+1, and N+2, CEM devices comprising elongated vias, for example, may be formed to conduct an electrical current between a greater number of layers of a wafer, such as from layer N (which may correspond to a substrate layer of a wafer) to layer N+3, N+4, and so on, and claimed subject matter is not limited in this respect. Thus, in certain embodiments, a CEM comprising elongated vias may operate as a through-substrate via, such as described in reference to through-substrate via 240 of FIG. 2B.

FIGS. 7A-7E illustrate various trapezoidal-shaped CEM devices disposed between layers of a wafer according to embodiments 700, 701, 702, 703, and 704. As shown in FIGS. 7A-7E, trapezoidal-shaped CEM devices may be fabricated or formed to connect directly with metal layers, to connect directly with metallic electrodes, and/or to connect with metallic vias, for example, and claimed subject matter is not limited in this respect. In particular embodiments, trapezoidal-shaped CEM devices, such as shown in FIGS. 7A-7E, may be fabricated utilizing a suitable process such as blanket deposition of a CEM on or over a substrate. Thus, in embodiments, such as embodiments 705-706 shown in FIGS. 7F and 7G, a CEM blanket comprising a thickness approximately in the range of 2.0 nm to 200.0 nm may be deposited over, for example, silicon nitride substrate 716 utilizing an appropriate deposition method. After deposition of a CEM blanket, a photoresist mask, such as photoresist mask 718 shown in FIG. 7F, may be positioned on or over locations of CEM 717 at which a CEM is to remain. A suitable etching process may then be utilized to remove CEM from exposed locations, which may leave behind trapezoidal-shaped CEM 720. In embodiments, an etching process gives rise to a trapezoidal-shaped CEM structure at least partially in response to CEM located closer to a surface of CEM region 717 being exposed to etchants for a longer period of time than regions located further from a surface of CEM region 717. In embodiments, a trapezoidal-shaped CEM structure, such as CEM 720 shown in FIG. 7G, may comprise a sloped sidewall having an angle of between approximately 45.0° and 90.0° in which a sidewall slope of 90.0° comprises a vertically-oriented sidewall. It should be noted, however, that trapezoidal-shaped CEM structures may comprise sidewalls having angles other than those ranging from approximately 45.0° to approximately 90.0°, such as 50.0°, 55.0°, 95.0°, 100.0°, and so forth, and claimed subject matter is not limited in this respect. It should additionally be noted that although an etching process has been described in connection with forming trapezoidal-shaped CEM 720, similar approaches may be applied to forming trapezoidal-shaped electrodes, such as electrodes 725 and 727.

Figure 7A:
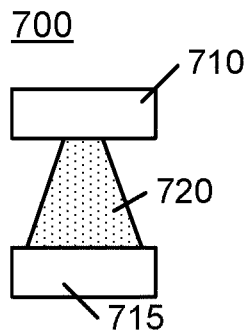
FIGS. 7A-7E illustrate various trapezoidal-shaped CEM devices disposed between layers of a wafer according to embodiments.
Figure 7B:
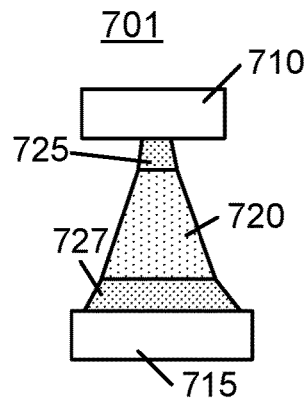
Figure 7C:
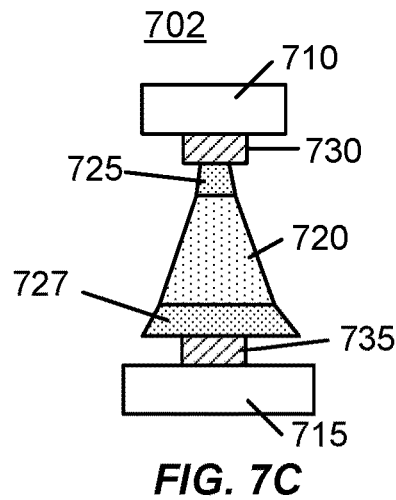
Figure 7D:
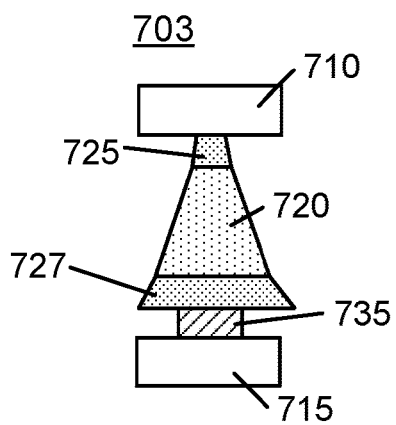
Figure 7E:
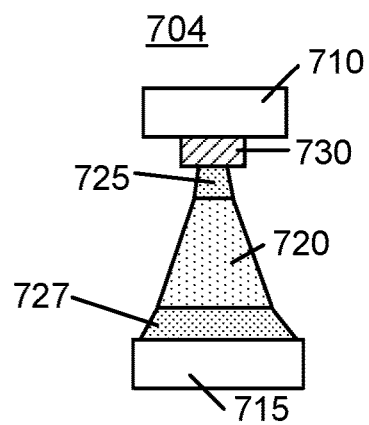
Figure 7F:
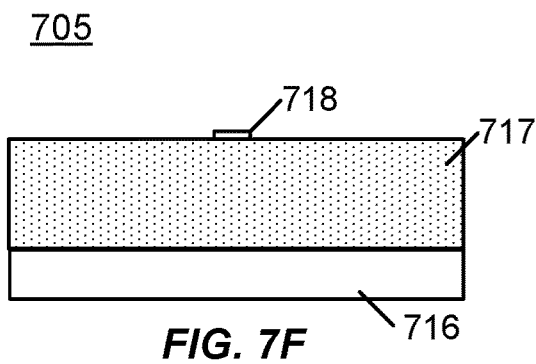
FIGS. 7F-7G illustrate subprocesses utilized in forming trapezoidal-shaped CEM devices of FIGS. 7A-7E according to embodiments.
Figure 7G:
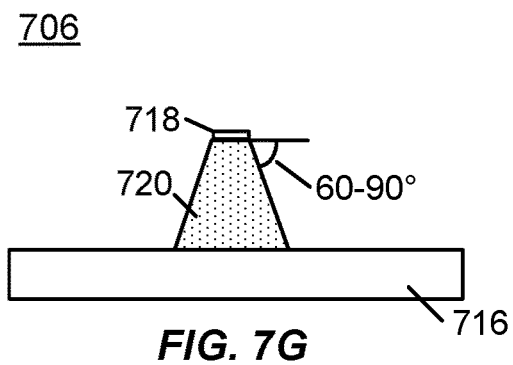

In embodiment 700, trapezoidal-shaped CEM material may be formed so as to come into direct contact with metallic layers 710 and 715. As shown in FIG. 7B, CEM 720 may be formed so as to contact with trapezoidal-shaped metallic electrodes 725 and 727. As shown in FIG. 7C, trapezoidal-shaped metallic electrodes 725 and 727 may be formed so as to contact conductive vias 730 and 735. Conductive via 730 may contact metal layer 710, and conductive via 735 may be formed so as to contact metal layer 715. As shown in FIGS. 7D and 7E, a first metallic electrode may be formed to contact a metal layer (e.g., metallic electrode 725 of FIG. 7D and/or metallic electrode 727 of FIG. 7E) and a second metallic electrode may be formed to contact a conductive via (e.g., metallic electrode 727 of FIG. 7D and/or metallic electrode 725 of FIG. 7E).

FIGS. 8A-8G illustrate various trapezoidal-shaped CEM devices disposed between layers of a wafer according to embodiments 800, 801, 802, 803, 804, 805, and 806. As shown in FIG. 8A-8G, trapezoidal-shaped CEM devices may be fabricated or formed to connect directly with metal layers, to connect directly with metallic electrodes, and/or to connect with metallic vias, for example, and claimed subject matter is not limited in this respect.

Figure 8A:
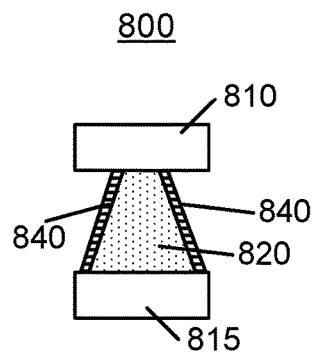
FIGS. 8A-8G illustrate various trapezoidal-shaped CEM device is disposed between layers of the wafer according to embodiments.
Figure 8B:
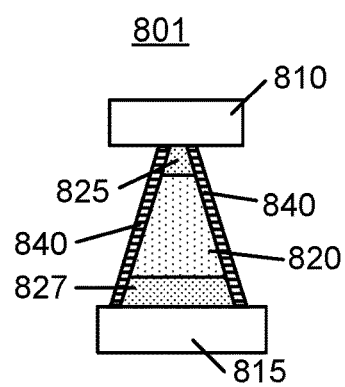
Figure 8C:
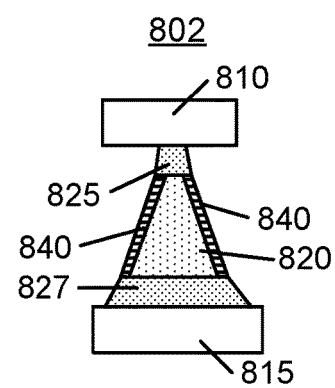
Figure 8D:
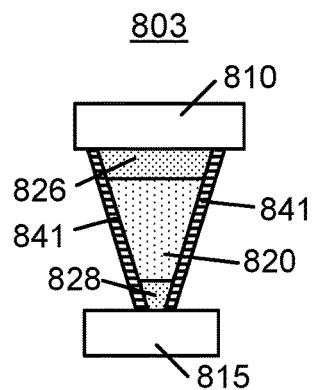

In particular embodiments, such as embodiments in accordance with FIG. 8D, inverted trapezoidal-shaped CEM devices may be fabricated utilizing a suitable process such as substrate etching followed by blanket deposition of CEM. Thus, in embodiments, such as embodiments 807-809 and 812 shown in FIGS. 8H-8J, an insulating material having a thickness approximately in the range of 2.0 nm to 200.0 nm, such as silicon nitride, may be deposited on or over substrate 816. Patterned photoresist mask 818 may be positioned on or over insulating material 817 as part of an etching process that operates to remove portions of insulating material 817. As shown in FIG. 8I, an etching process may give rise to a trapezoidal-shaped cavity at least partially in response to insulating material closer to a surface of insulating material 817 being exposed to etchants for a longer period of time than regions located further from a surface of insulating material 817. As shown in FIG. 8J (embodiment 809), CEM 820 may be deposited into a trapezoidal-shaped cavity utilizing any suitable deposition approach. As shown in FIG. 8K (embodiment 812), perhaps in response to chemical-mechanical planarization (CMP), CEM shaped as an inverted trapezoid, may remain.

Figure 8E:
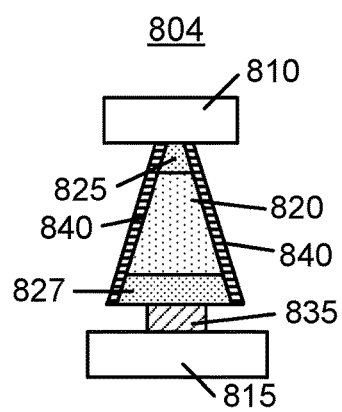
Figure 8F:
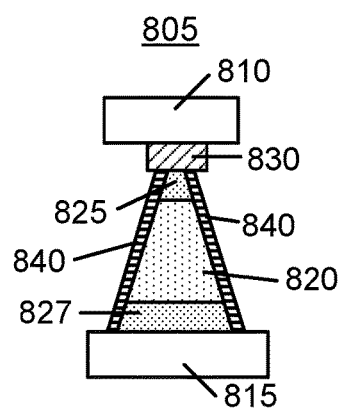
Figure 8G:
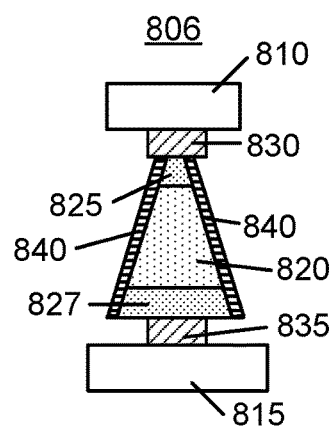

Returning to embodiment 800, trapezoidal-shaped CEM 820, which may be surrounded by spacer material 840, may be formed so as to come into direct contact with metallic layers 810 and 815. As shown in FIG. 8B, CEM 820 may be formed so as to come into contact with trapezoidal-shaped metallic electrodes 825 and 827. CEM 820 of FIG. 8B may be surrounded by spacer material 840, which may operate to protect and/or insulate CEM 820 from surrounding devices. As shown in FIG. 8C, spacer material may surround CEM 820, without surrounding metallic electrodes 825 and 827. As shown in FIG. 8D, CEM 820 may comprise an inverted trapezoid shape, and may be surrounded by spacer material 840. Spacer material 840 may additionally surround metallic electrodes 826 and 828, which may also comprise an inverted trapezoid shape. As shown in FIGS. 8E and 8F, a first metallic electrode may be formed to contact a metal layer (e.g., metallic electrode 825 of FIG. 8E and/or metallic electrode 827 of FIG. 8F) and a second metallic electrode may be formed to contact a conductive via (e.g., metallic electrode 827 of FIG. 8E and/or metallic electrode 825 of FIG. 8F). As shown in FIG. 8G (embodiment 806) metallic electrodes 825 and 827 may be formed to contact conductive vias 830 and 835, for example.

FIG. 9A is a flowchart for a method for forming devices from CEM according to a stage of a wafer fabrication process according to an embodiment 900. Example implementations, such as described in FIG. 9A, and other figures described herein, may include blocks in addition to those shown and described, fewer blocks or blocks occurring in an order different than may be identified, or any combination thereof. The method may begin at block 910, which may comprise determining electrical characteristics of one or more CEM devices to be formed in a wafer fabrication process. In particular embodiments, block 910 may be performed responsive to determining that particular device operational performance profiles may be possible for devices formed at differing stages of a wafer fabrication process. For example, for transistor or transistor-based CEM circuitry formed at a front-end-of-line of a wafer fabrication process, a performance profile may express current flow responsive to an applied voltage. However, at other stages of a wafer fabrication process, such as middle-of-line, back-end-of-line, and 2.5D/3D system integration, for example, access devices coupled to CEM-based memory cells may be difficult to fabricate. Accordingly, performance profiles for devices fabricated at such stages of a wafer fabrication process may express different types of performance profiles, such as, for example, switching speed responsive to current or current density, just to name an example.

The method of FIG. 9A may continue at block 920, which may comprise forming one or more CEM devices having particular physical dimensional parameters and/or compositional parameters. In block 920, forming physical dimensional parameters and/or compositional parameters may occur in response to receipt of specified application performance parameters for a CEM device or a device that is to include one or more CEMs. Accordingly, in one possible example, for a high-current switching application to be performed at a back-end-of-line of a wafer fabrication process, a CEM device may be doped with a particular dopant species at a suitable atomic concentration, such as an atomic concentration of dopant approximately in the range of 10.0% to 15.0%, to permit the CEM to perform the high-current switching application.

Figure 9B:
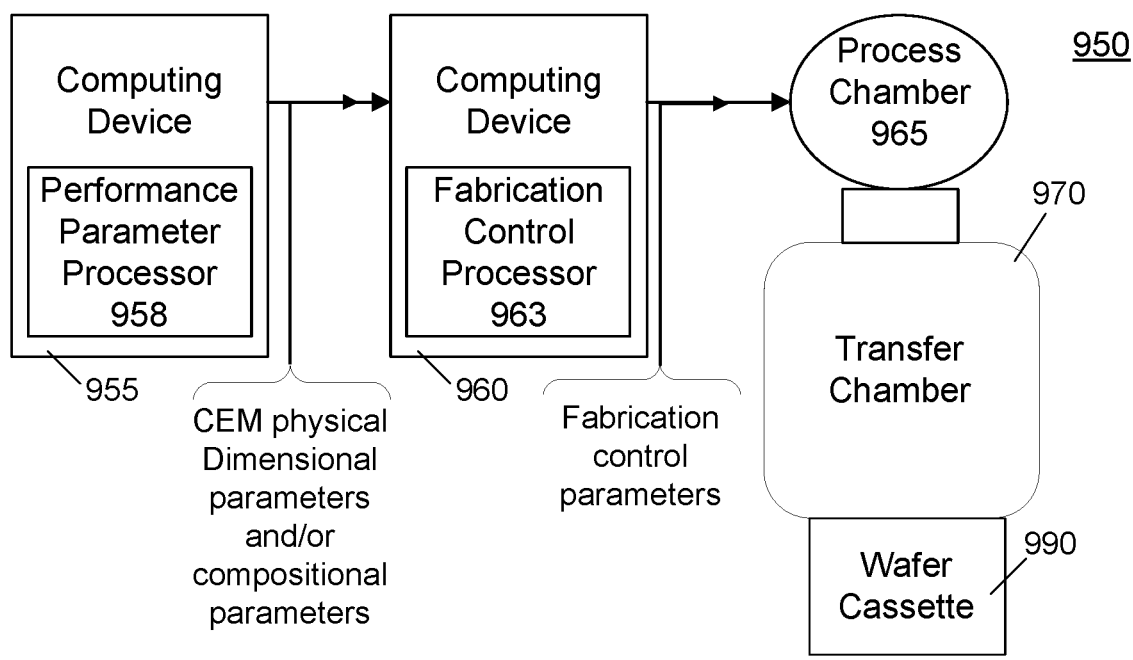
FIG. 9B is a schematic of a system for forming CEM devices according to an embodiment.

FIG. 9B is a schematic of a system for forming CEM devices according to an embodiment 950. Computing device 955 may comprise performance parameter processor 958, which may operate to specify physical dimensional and/or compositional parameters of one or more CEM devices to be formed at a stage of a fabrication process. In certain embodiments, processor 958 may use or access a database of particular device operational performance parameters that may be possible for devices formed at differing stages of a wafer fabrication process. In embodiments, such operational performance parameters may be linked to, for example, CEM physical dimensional parameters and/or compositional parameters. In particular embodiments, a database, accessible to performance parameter processor 958, may comprise a physical dimensional and/or compositional parameters of transistors, access devices, logic devices, for example, that may be formed at a front-end-of-line stage of a wafer fabrication process. A database accessible to processor 958 may additionally comprise physical dimensional and/or compositional parameters of switching devices, through-substrate vias, interposers, and a variety of additional other devices that may be formed at middle-of-line, the back-end-of-line, and 2.5D/3D system integration stages of a wafer fabrication process. For example, if a particular current versus applied voltage for a memory access device has been specified, (e.g., as indicated by profile 277 of FIG. 2C) performance parameter processor 958 may specify particular physical dimensional parameters and/or compositional parameters of one or more CEM devices that exhibit the specified current versus applied voltage profile.

In embodiment 950, computing device 960 may obtain CEM physical dimensional parameters and/or compositional parameters and may generate particular device settings and other control parameters to be utilized by process chamber 965, transfer chamber 970, and wafer cassette 990. For example, responsive to computing device 960 obtaining one or more CEM physical dimensional parameters and/or compositional parameters, fabrication control processor 963 may operate to specify fabrication control parameters, such as dopant precursors to be utilized by process chamber 965, to form CEM devices that meet specified application performance parameters. Other fabrication control parameters generated by fabrication control processor 963 may include CEM material selections, dopant concentration profiles utilized during deposition processes, annealing temperatures, exposure durations, and a variety of additional settings utilized by process chamber 965, and claimed subject matter is not limited in this respect. In embodiments, after fabrication of one or more wafers comprising CEM devices, transfer chamber may transport fabricated wafers to wafer cassette 990 for singulation and/or other postprocessing of fabricated CEM wafers. In embodiments, process chamber 965 may be utilized to form CEM devices having a depth of between 2.0 nm and 200.0 nm. Accordingly, process chamber 965 may be utilized to form front-end-of-line CEM devices, middle-of-line CEM devices, back-end-of-line devices, and CEM devices utilized in 2.5D/3D system integration of wafers, and claimed subject matter is not limited in this respect.

In embodiments, computing devices 955 and 960 may comprise a memory or storage device, which may include primary and secondary memories, which may communicate with processors 958 and 960 utilizing, for example, an internal bus structure, for example. Computing devices 955 and 960 may represent one or more sources of analog, uncompressed digital, lossless compressed digital, and/or lossy compressed digital formats for content of various types, such as video, imaging, text, audio, etc. in the form physical states and/or signals, for example. Computing device 955 may communicate with one another by way of a connection, such as an internet connection, for example. Although computing devices 955 and 960 of FIG. 9B show only a few components, claimed subject matter is not limited to computing devices having only these components as other implementations may include alternative arrangements that may comprise additional components or fewer components, such as components that function differently while achieving similar results. It is not intended that claimed subject matter be limited in scope to illustrative examples.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of forming a plurality of correlated electron material (CEM) devices on a wafer, comprising:
forming, at a first stage of a plurality of stages of a manufacturing operation, at least a first CEM device of the plurality of CEM devices to operate at a first layer of the wafer according to a first set of particular physical dimensional parameters or compositional parameters, or a combination thereof, to implement a first performance profile for the first CEM device, wherein the plurality of stages of the manufacturing operation include a front-end-of-line stage, a middle-of-line stage, back-end-of-line stage and/or a system integration stage, or any combination thereof; and forming, at a second stage of the plurality of stages of the manufacturing operation, at least a second CEM device of the plurality of CEM devices to operate at a second layer positioned over the first layer of the wafer, wherein the second CEM device to exhibit a performance profile different from the first performance profile for the first CEM device.

2. The method of claim 1, wherein the second stage of the manufacturing operation comprises the middle-of-line stage of the manufacturing operation, the at least the second CEM device to operate as an interconnect.

3. The method of claim 2, wherein the forming the at least the second CEM device comprises forming the at least the second CEM device to exhibit a resistance of less than 1.6 microohm-cm while in a lower-resistance state.

4. The method of claim 3, wherein the forming the at least the second CEM device comprises providing a dopant during forming of the at least the second CEM device to bring about an atomic concentration of dopant within at least a portion of the at least the second CEM device of between 0.1% and 15.0%.

5. The method of claim 2, wherein the forming the at least the second CEM device comprises forming the at least the second CEM device to exhibit a resistance of greater than 16.0 microohm-cm while in a higher-resistance state.

6. The method of claim 1, wherein the forming the at least the first CEM device comprises forming the at least the first CEM device to operate as a logic device, and wherein the first stage of the manufacturing operation comprises the front-end-of-line stage of the manufacturing operation.

7. The method of claim 6, wherein the logic device to exhibit a leakage current of less than 100.0 nA/micron under an applied voltage of less than 1.2 Volt.

8. The method of claim 1, further comprising forming a spacer to fill at least a portion of a trench separating the first CEM device from a second device and/or structure positioned at the first layer.

9. The method of claim 8, wherein the spacer to be formed to be in contact with the-first CEM device and one or more electrodes of the first CEM device.

10. The method of claim 1, wherein the at least the second CEM device to comprise a sloped sidewall having an angle of between approximately 45.0° and 90.0°.

11. The method of claim 1, wherein the second CEM device to comprise a through-substrate via which contacts an electrode of the first CEM device.

12. The method of claim 11, wherein the through-substrate via to exhibit a resistance of less than 1.6 microohm-cm while in a lower-resistance state.

13. The method of claim 11, wherein the through-substrate via to exhibit a resistance of greater than 16.0 microohm-cm while in a higher-resistance state.

14. The method of claim 1, wherein the at least one first CEM device to comprise one or more transistors, diodes, access devices or a sensors, or any combination thereof.

15. The method of claim 1, wherein the at least one first CEM device to comprise a memory device, and wherein the at least one CEM device to exhibit a leakage current of less than 100.0 nA/micron under an applied voltage of less than 1.2 volts.

16. The method of claim 1, wherein the first performance profile to exhibit a current flow in the first CEM device responsive to one or more applied voltages.

17. The method of claim 1, wherein the at least one second CEM device to comprise a routing layer, an optical interconnect or one or more elements of an antenna, or a combination thereof.

* * * * *